United States Patent
Setty

(10) Patent No.: US 6,466,085 B2
(45) Date of Patent: Oct. 15, 2002

(54) AMPLIFIER CIRCUIT AND PRECONDITIONING CIRCUIT FOR USE IN AMPLIFIER CIRCUIT

(75) Inventor: Suma Setty, Maidenhead (GB)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/739,636

(22) Filed: Dec. 20, 2000

(65) Prior Publication Data

US 2001/0006353 A1 Jul. 5, 2001

(30) Foreign Application Priority Data

Dec. 24, 1999 (GB) ............................................... 9930675

(51) Int. Cl.[7] .................................................. H03F 3/45
(52) U.S. Cl. ........................ 327/563; 327/308; 327/352
(58) Field of Search ........................ 327/77, 308, 355, 327/359, 361, 351, 352, 563; 330/254

(56) References Cited

U.S. PATENT DOCUMENTS

| 4,816,772 A | | 3/1989 | Klotz ........................ 330/254 |
| 5,418,494 A | * | 5/1995 | Betti et al. .................. 330/254 |
| 5,572,166 A | | 11/1996 | Gilbert ....................... 330/254 |
| 5,682,119 A | * | 10/1997 | Soda .......................... 330/254 |
| 5,896,063 A | * | 4/1999 | Marsh et al. ............... 327/359 |
| 5,900,782 A | * | 5/1999 | Igarashi et al. ............. 330/254 |
| 5,999,053 A | * | 12/1999 | Eschauzier ................. 327/346 |
| 6,040,731 A | * | 3/2000 | Chen et al. ................. 327/359 |
| 6,215,989 B1 | * | 4/2001 | Otaka ........................ 330/254 |

* cited by examiner

Primary Examiner—Timothy P. Callahan
Assistant Examiner—Terry L. Englund
(74) Attorney, Agent, or Firm—Burns Doane Swecker & Mathis LLP

(57) ABSTRACT

A control signal is conditioned such that it produces a conditioned control signal that is the sum of two exponentially varying components. The resulting conditioned control signal, applied to an amplifier circuit, produces a gain that varies linearly in dB with changes in the voltage of the control signal.

12 Claims, 3 Drawing Sheets

AMPLIFIER CIRCUIT AND PRECONDITIONING CIRCUIT FOR USE IN AMPLIFIER CIRCUIT

This application claims priority under 35 U.S.C. §§119 and/or 365 to 9930675.5 filed in United Kingdom on Dec. 24, 1999; the entire content of which is hereby incorporated by reference.

FIELD OF THE INVENTION

The invention relates to an electronic circuit, and in particular to a variable gain amplifier circuit.

BACKGROUND OF THE INVENTION

It is desirable in some situations to provide a variable gain amplifier, in which the gain varies logarithmically with a control signal, to produce an output signal which produces a linear change in output signal level measured in dB, in response to a linear change in input signal level.

U.S. Pat. No. 5,572,166 describes a variable gain amplifier, in which a linear change in a gain control current produces an exponential change in gain, thereby providing linear-in-decibel gain control.

U.S. Pat. No. 4,816,772 discloses a variable gain amplifier with multiple cascode amplifier stages, connected in cascade. A control voltage is applied to a linearization circuit, the output of which is input to a voltage controlled voltage source, which produces a conditioned control voltage. The conditioned control voltage is fed back to the linearization circuit and is provided to each of the multiple cascode amplifier stages. The conditioned control voltage controls the amplifier stages such that a linear change in the control voltage produces a linear change in dB of the overall gain of the circuit.

SUMMARY OF THE INVENTION

In accordance with one aspect of the invention, a control signal is conditioned such that it produces a conditioned control signal which is the sum of an exponentially varying component and a constant component. The resulting conditioned control signal, applied to an amplifier circuit, produces a gain which varies linearly in dB with changes in the control voltage.

In accordance with a second aspect of the invention, a control signal is applied to an amplifier made up of a plurality of variable gain attenuator stages, the control signal having been conditioned such that it produces a gain which varies linearly in dB with changes in the control voltage.

DETAILED DESCRIPTION OF PREFERRED EMBODIMENTS

Figure 1:
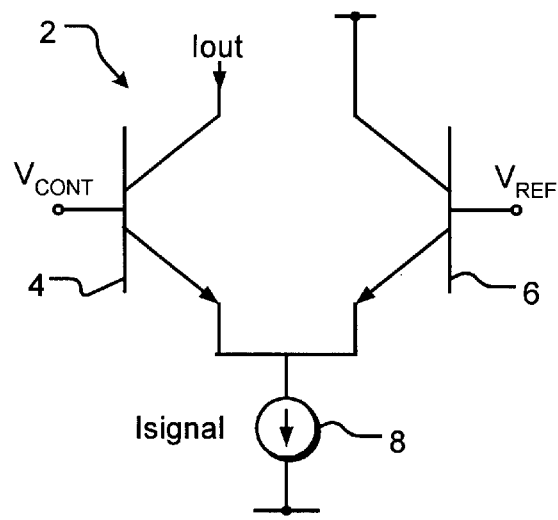
FIG. 1 is a schematic circuit diagram of an attenuator stage forming part of an amplifier circuit in accordance with the invention.

FIG. 1 shows a variable gain attenuator 2, which is based around a long-tailed pair of bipolar transistors 4, 6, the emitter terminals of which are connected together. A signal current Isignal, represented as a current source 8, is applied to the emitters of the transistors 4, 6. A control voltage $V_{CONT}$ is applied to a base terminal of a first of the transistors 4, while the base terminal of the second transistor 6 is held at a constant reference voltage $V_{REF}$. The relative sizes of the voltages $V_{CONT}$, $V_{REF}$ determine what fraction of the signal current Isignal is steered through each of the transistors 4, 6, and the current Iout through the first transistor 4 is taken as the attenuator output current. Thus, the circuit of FIG. 1 acts as a controllable attenuator.

Figure 2:
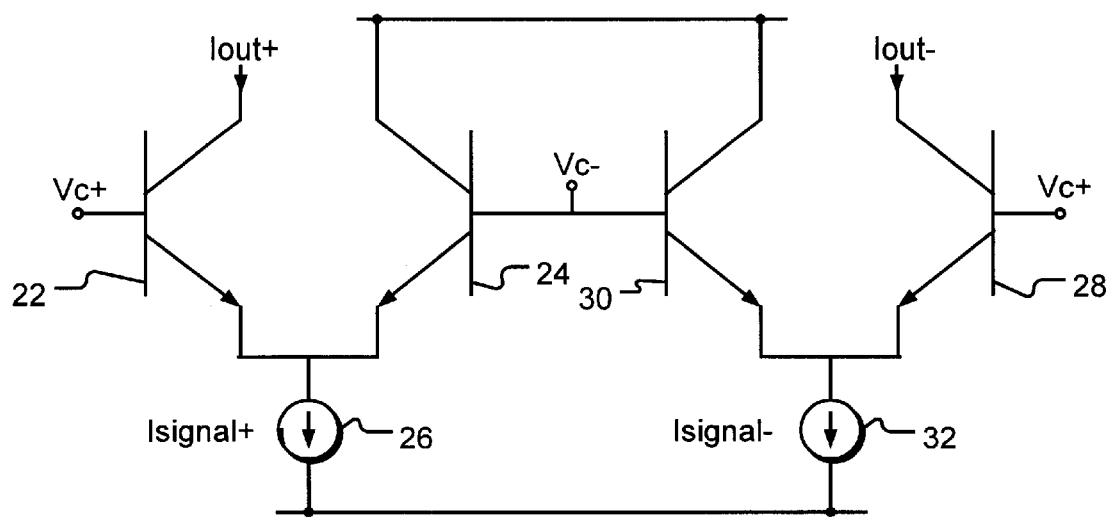
FIG. 2 is a schematic circuit diagram of an alternative attenuator stage forming part of an amplifier circuit in accordance with the invention.

FIG. 2 shows a differential current steering attenuator, acting on the same principle as the circuit of FIG. 1.

A first long-tailed pair is made up of transistors 22, 24 with their emitter terminals connected together. A positive signal current Isignal+, represented as a current source 26, is applied to the emitter terminals of the transistors 22, 24. A second long-tailed pair is made up of transistors 28, 30 with their emitter terminals connected together. A negative signal current Isignal−, represented as a current source 32, is applied to the emitter terminals of the transistors 28, 30.

A positive control signal Vc+ is applied to the base terminals of the transistors 22, 28, while a negative control signal Vc− is applied to the base terminals of the transistors 24, 30. The collector terminals of the transistors 24, 30 are connected together, for example to a positive supply voltage.

A fraction of the positive signal current Isignal+ is steered through the transistor 22, and this fraction is the positive output current Iout+. The size of the fraction is determined by the difference between the positive control signal Vc+ and the negative control signal Vc−.

Similarly, a fraction of the negative signal current Isignal− is steered through the transistor 28, and this fraction is the negative output current Iout−. Again the size of the fraction is determined by the difference between the positive control signal Vc+ and the negative control signal Vc−.

Thus, a differential output current is produced, the magnitude of which is determined by the magnitude of the differential input current. The relationship between these two, that is, the degree of attenuation introduced by the circuit, is determined by the magnitude of the differential control voltage.

In fact, the gain factor Y(x) of each variable gain attenuator circuit is related to the magnitude of the control voltage x by a relationship:

$$Y(x) = \frac{1}{1 + e^{\frac{-qx}{kT}}}$$

where (kT/q) is the thermal voltage of the transistors.

In order to produce a gain factor which varies linearly in dB with changes in the control voltage, the control voltage x is preprocessed to produce a preprocessed control voltage signal V(x), which is a function of x. As discussed, it is desired that the gain factor Y(V(x)) produced by the preprocessed control voltage varies linearly in dB with changes in the control voltage. Thus, it is desired that:

$$20 \cdot \log\left(\frac{1}{1+e^{\frac{-qV}{kT}}}\right) \propto x$$

Put differently:

$$\frac{d}{dx}\left[20 \cdot \log\left(\frac{1}{1+e^{\frac{-qV}{kT}}}\right)\right] = \text{const.}$$

Solving this equation for V gives the result that the desired form of preprocessing is that which gives:

$$V(x) = \frac{-kT}{q} \cdot \ln(3.35 \cdot e^{-21.87 \cdot x} - 1)$$

Figure 3:
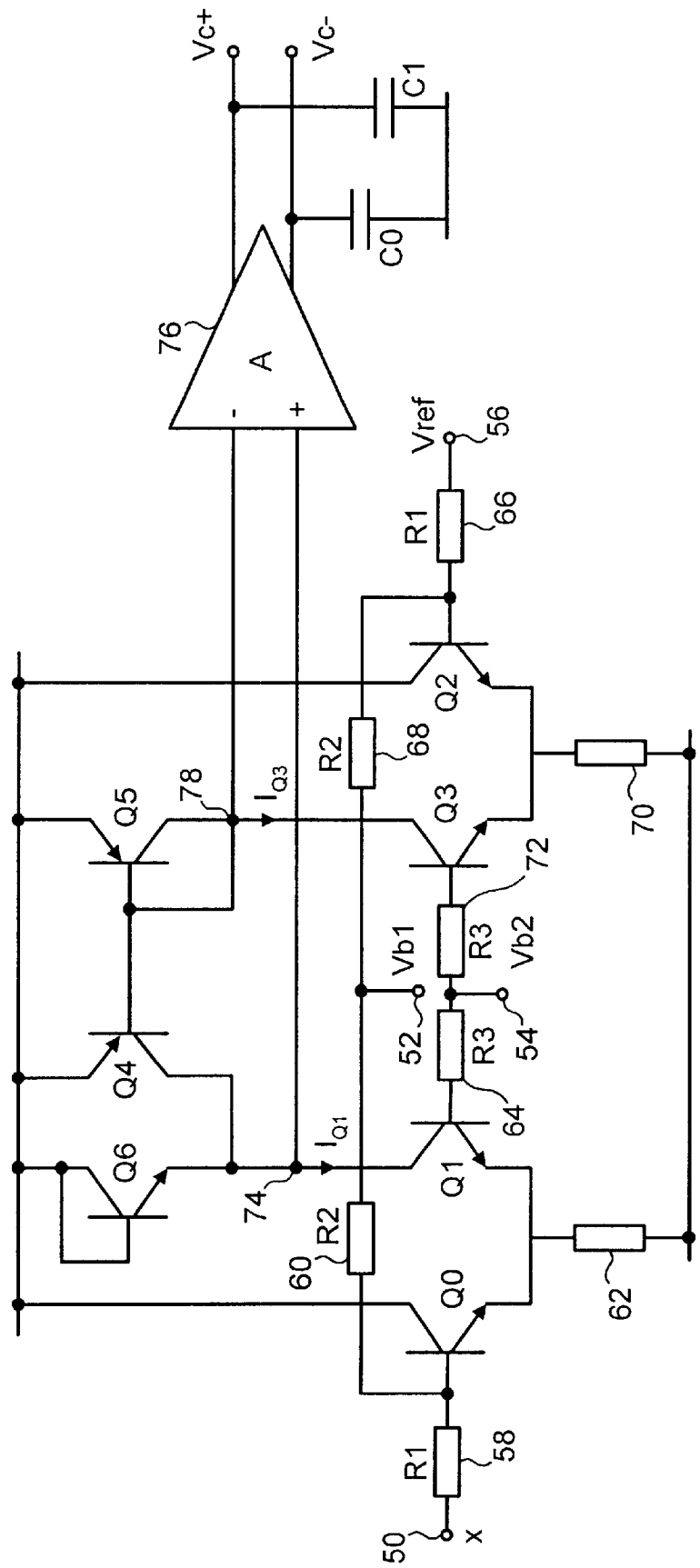
FIG. 3 is a schematic circuit diagram of a conditioning circuit forming part of a circuit in accordance with the invention.

FIG. 3 is a schematic circuit diagram of the preprocessing circuit used to produce a preprocessed control voltage V from the input x which has this desired form, and can therefore be used to control the variable gain atttenuator circuit FIG. 2.

In fact, in order to make the circuit more easily realisable in bipolar technology, the circuit of FIG. 3 preprocesses the input signal x to produce a preprocessed signal V which is of the form:

$$V(x) = \frac{kT}{q} \cdot \ln\left(I_b \cdot e^{\frac{-((Vb+A \cdot x) \cdot q)}{kT}} - I_b \cdot e^{\frac{-((Vb+A \cdot Vref) \cdot q)}{kT}}\right)$$

The circuit of FIG. 3 receives the input linear control signal x at an input terminal 50. The circuit also receives a differential bias voltage Vb (=Vb1−Vb2) at input terminals 52, 54 respectively.

Figure 4:
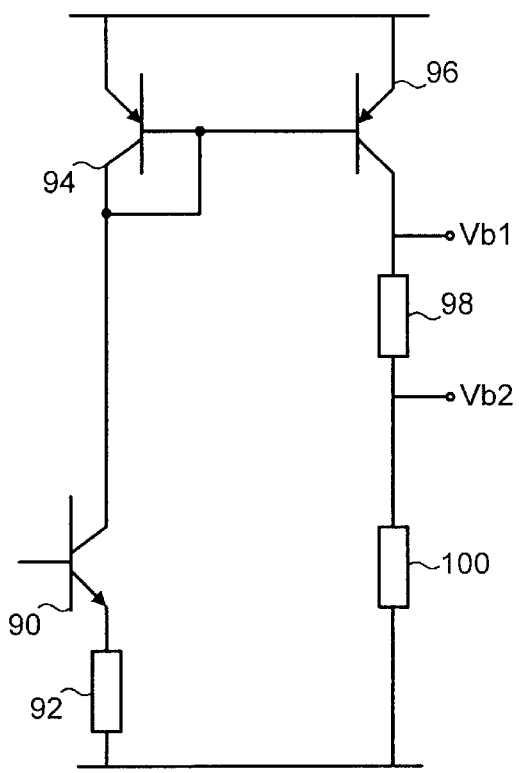
FIG. 4 is a schematic circuit diagram of a component of a conditioning circuit forming part of a circuit in accordance with the invention.

FIG. 4 shows a circuit for generating the voltages Vb1 and Vb2. A known reference voltage is applied to the base of a transistor 90, the emitter terminal of which is connected to ground through a resistor 92, and the collector terminal of which is connected to a positive supply through a PNP transistor 94, which forms part of a current mirror with a second PNP transistor 96. The collector terminal of the second PNP transistor 96 is connected to ground through two resistors 98, 100. Thus, a known current is drawn through these resistors, and the voltages Vb1, Vb2 can be taken from the terminals of the resistor 98, by appropriate selection of component values.

The circuit of FIG. 3 also receives a reference voltage Vref at input terminal 56.

Figure 5:
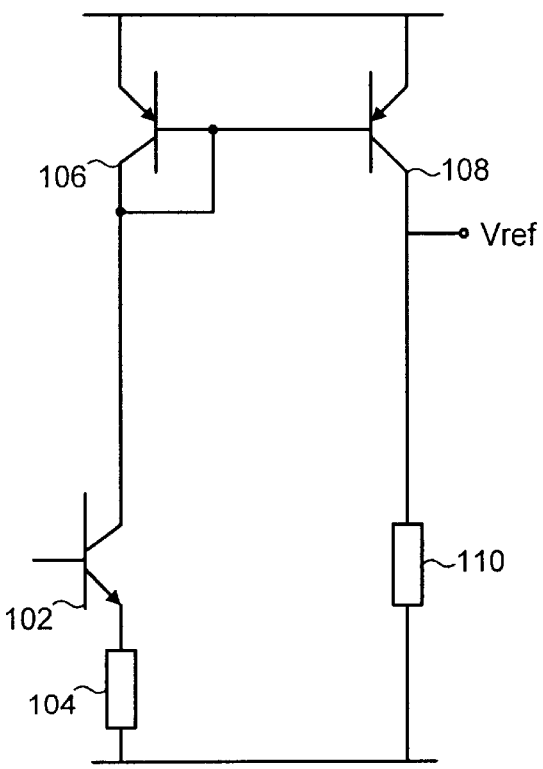
FIG. 5 is a schematic circuit diagram of a further component of a conditioning circuit forming part of a circuit in accordance with the invention.

FIG. 5 shows a circuit for generating the voltage Vref. A known reference voltage is applied to the base of a transistor 102, the emitter terminal of which is connected to ground through a resistor 104, and the collector terminal of which is connected to a positive supply through a PNP transistor 106, which forms part of a current mirror with a further PNP transistor 108. The collector terminal of the further PNP transistor 108 is connected to ground through a resistor 110. Thus, a known current is drawn through this resistor, and the reference voltage Vref can be taken from the junction of this resistor with the collector terminal of the transistor 108, by appropriate selection of component values.

Returning to the circuit of FIG. 3, the control voltage x is attenuated by resistors 58, 60, having values R1, R2 respectively. These resistors provide an attenuation factor A, such that the proportion of the input voltage which is applied to the base of transistor Q0 is A.x. The attenuation ensures that the transistor Q0 does not move into the saturated region of operation.

Transistor Q0 forms a long-tailed pair with a transistor Q1, their emitters being connected together, and connected to a negative supply through a resistor 62. The voltages Vb1, Vb2, taken from the terminals of the resistor 98 and applied to input terminals 52, 54, as discussed earlier, are applied to base terminals of transistors Q0, Q1 respectively through resistors 60, 64.

The differential voltage applied to the base terminals of the transistors ensures that the long-tailed pair is kept switched such that a very much larger fraction of the total current flows through transistor Q0 than through Q1. As a result, the current $I_{Q1}$ through the transistor Q1 has a negative exponential relationship with the control voltage x. In other words:

$$I_{Q1} \propto e^{-x}$$

This provides the required negative exponential relationship between V and x discussed above. The required relationship between V and x also includes a constant current component, which is obtained as follows.

The reference voltage Vref, obtained from the circuit of FIG. 5 as discussed earlier, is attenuated by resistors 66, 68, having the same values as resistors 58, 60, namely R1 and R2 respectively. These resistors provide an attenuation factor A, such that the proportion of the reference voltage which is applied to the base of transistor Q2 is A.Vref.

Transistor Q2 forms a long-tailed pair with a transistor Q3, their emitters being connected together, and connected to a negative supply through a resistor 70. The voltages Vb1, Vb2, taken from the terminals of the resistor 98 and applied to input terminals 52, 54, as discussed earlier, are applied to base terminals of transistors Q2, Q3 respectively through resistors 68, 72. Resistor 68 has a resistance value R2 matching that of resistor 60, while resistor 72 has a resistance value R3 matching that of resistor 64. Transistors Q2, Q3 match transistors Q0, Q1.

The differential voltage applied to the base terminals of the transistors Q2 and Q3 ensures that the long-tailed pair is kept switched such that a very much larger fraction of the total current flows through transistor Q2 than through Q3. As a result, the current $I_{Q3}$ through the transistor Q3 has a negative exponential relationship with the constant reference voltage Vref. The matching of the long-tailed pair Q2/Q3 with the long-tailed pair Q0/Q1 ensures that the two exponential relationships track each other. Specifically, although the currents in the resistors 62, 70 each have small positive temperature coefficients, those currents track each other. Resistors 62, 70 could be replaced by constant current sources, if desired.

The negative exponential relationship with the constant reference voltage Vref provides the required constant current component discussed above.

The collector terminal of transistor Q3 is connected to the collector terminal of a PNP transistor Q5, which is connected to PNP transistor Q4 to form a current mirror circuit, such that $I_{Q3}$ flows in Q4 also. The collector terminal of transistor Q4 is connected to the collector terminal of transistor Q1. A diode connected transistor Q6, that is, having its base and collector terminals connected together and connected to a positive supply, has its emitter terminal connected to the collector terminals of transistors Q1 and Q4. Thus, the current $I_{Q6}$ flowing in the transistor Q6 is the difference between the currents flowing in transistors Q1 and Q4. Thus, $I_{Q6} = I_{Q1} − I_{Q3}$.

Moreover, the base emitter voltage of the transistor Q6, namely the voltage V74 at the node 74 between the collector terminals of transistors Q1 and Q4, has a logarithmic relationship to the current flowing in Q6. Thus:

$$V74 = \frac{kT}{q} \cdot \ln(I_{Q6})$$

This voltage V74 therefore has the required relationship to the input x.

In fact, as discussed above, the currents $I_{Q1}$ and $I_{Q3}$, and hence $I_{Q6}$ are relatively small, at least compared to the total currents flowing in the long-tailed pair resistors 62, 70. Therefore, in order to provide sufficient drive to the transistors of the long-tailed pair or pairs in the variable gain attenuator, a buffer amplifier 76 is provided, with its first input connected to the node 74. The buffer amplifier can also be used to convert the single-ended voltage at node 74 into a differential voltage for use in the differential variable gain attenuator of FIG. 2. In that case, the second input of the buffer amplifier 76 is connected to a node 78 between the collector terminals of transistors Q3, Q5. Since the two long-tailed pair subcircuits track each other, as discussed above, the DC levels at the nodes 74, 78 therefore also track each other, and the difference between the voltage levels there provides the required differential voltage.

At the output of the buffer amplifier 76, there are provided the required positive control signal Vc+ and the negative control signal Vc− for supply to the variable gain attenuator of FIG. 2. Capacitors C0 and C1, connected between the respective output lines and the negative supply, limit the noise supplied to the variable gain attenuator circuit.

There is thus provided a circuit for preprocessing a control voltage such that, when the preprocessed control voltage is applied to a variable gain attenuator, the gain in dB varies linearly with the control voltage.

What is claimed is:

1. A preprocessing circuit, comprising:
   first and second transistors, having their emitters connected together, and together drawing a first reference current;
   a first reference voltage supply, for applying a first reference voltage between base terminals of the first and second transistors;
   an input terminal, for applying an input control voltage to the base terminal of one of the first and second transistors, such that a first output current through the other of the first and second transistors is an inverse exponential function of the input control voltage and the first reference voltage;
   a circuit for generating a second output current;
   a device for generating a third output current that is a sum of the first and second output currents; and
   an output terminal, for supplying a voltage logarithmically related to the third output current as an output preprocessed control signal.

2. A preprocessing circuit as claimed in claim 1, wherein the device for generating the third output current comprises a diode, and a voltage across the diode is said voltage logarithmically related to the third output current.

3. A preprocessing circuit as claimed in claim 1, wherein the circuit for generating the second output current comprises:
   third and fourth transistors, having their emitters connected together, and together drawing a second reference current; and
   means for applying a constant second reference voltage between base terminals of the third and fourth transistors.

4. A preprocessing circuit, comprising:
   first and second transistors, having their emitters connected together, and together drawing a first reference current;
   third and fourth transistors, having their emitters connected together, and together drawing a second reference current;
   a first reference voltage supply, for applying a first reference voltage between base terminals of the first and second transistors;
   an input terminal, for applying an input control voltage to the base terminal of the first transistor;
   a second reference voltage supply, for applying a second reference voltage between base terminals of the third and fourth transistors;
   such that a first output current through the second transistor is an inverse exponential function of the input control voltage and the first reference voltage and such that a second output current through the fourth transistor is an inverse exponential function of the second reference voltage;
   a diode, for generating through the diode a third output current that is a function of the first and second output currents; and
   a first output terminal, for supplying a voltage across the diode as an output preprocessed control signal.

5. A preprocessing circuit as claimed in claim 4, wherein the first reference voltage supply includes first and second reference voltage terminals, having the first reference voltage therebetween, connected to base terminals of the first and second transistors;
   and wherein the second reference voltage supply includes the first and second reference voltage terminals, connected to base terminals of the third and fourth transistors, and a third reference voltage supply for applying a constant third reference voltage to the base terminal of the third transistor.

6. A preprocessing circuit as claimed in claim 5, wherein:
   the input terminal and third reference voltage supply are connected to the base terminal of the first transistor and the base terminal of the third transistor respectively through matched first resistors;
   the first reference voltage terminal is connected to the base terminals of the first transistor and the third transistor respectively through matched second resistors; and
   the second reference voltage terminal is connected to the base terminals of the second transistor and the fourth transistor respectively through matched third resistors.

7. A preprocessing circuit as claimed in claim 4, further comprising a current mirror circuit including first and second current mirror transistors, the first current mirror transistor being connected to the fourth transistor and having the second output current flowing therethrough, and the second current mirror transistor being connected to the second transistor and the diode, such that the third output current is the difference between the first and second output currents.

8. A preprocessing circuit as claimed in claim 4, further comprising a second output terminal, connected to a collector terminal of the fourth transistor.

9. A preprocessing circuit as claimed in claim 8, further comprising a buffer amplifier, connected between the first and second output terminals.

10. An amplifier circuit, comprising:
    a long-tailed pair of transistors having their emitter terminals connected together, and together drawing a specified current; and a preprocessing circuit, the preprocessing circuit comprising:

first and second transistors, having their emitters connected together, and together drawing a first reference current;

third and fourth transistors, having their emitters connected together, and together drawing a second reference current;

a first reference voltage supply, for applying a first reference voltage between base terminals of the first and second transistors;

an input terminal, for applying an input control voltage to the base terminal of the first transistor;

a second reference voltage supply, for applying a second reference voltage between base terminals of the third and fourth transistors;

such that a first output current through the second transistor is an inverse exponential function of the input control voltage and the first reference voltage and such that a second output current through the fourth transistor is an inverse exponential function of the second reference voltage;

a diode, for generating through the diode a third output that is a function of the first and second output currents; and an output terminal, connected to the base terminal of a transistor of said long-tailed pair, for supplying a voltage across the diode thereto as a preprocessed control signal.

11. An amplifier circuit, comprising:

first and second long-tailed pairs of transistors, the transistors of each pair having their respective emitter terminals connected together, and the transistors of each pair together drawing a specified current; and a preprocessing circuit, the preprocessing circuit comprising:

first and second transistors, having their emitters connected together, and together drawing a first reference current;

third and fourth transistors, having their emitters connected together, and together drawing a second reference current;

a first reference voltage supply, for applying a first reference voltage between base terminals of the first and second transistors;

an input terminal, for applying an input control voltage to the base terminal of the first transistor;

a second reference voltage supply, for applying a second reference voltage between base terminals of the third and fourth transistors;

such that a first output current through the second transistor is an inverse exponential function of the input control voltage and the first reference voltage and such that a second output current through the fourth transistor is an inverse exponential function of the second reference voltage;

a diode, for generating through the diode a third output current that is a function of the first and second output currents;

a first output terminal, connected to supply a voltage across said diode as an output preprocessed control signal to a base terminal of a respective first transistor in each long-tailed pair; and a second output terminal, connected to a collector terminal of the fourth transistor, and supplying a voltage thereon to a base terminal of a respective second transistor in each long-tailed pair.

12. An amplifier circuit, comprising:

a variable gain attenuator, including an input to receive an input signal and a control input to control the gain thereof; and a preprocessing circuit, for receiving a first control signal and producing a preprocessed control signal for supply to the control input of the variable gain attenuator, such that the gain of the variable gain attenuator, measured in dB, is proportional to the level of the first control signal, the preprocessing circuit comprising:

a pair of first and second transistors having their emitters connected together and drawing a reference current, for flowing a first current in one transistor of the transistor pair in response to receiving the control signal;

a current mirror circuit, for generating mirrored current; and a diode, for flowing therein a second current corresponding to a sum of the first current and the mirrored current, wherein the preprocessed control signal is based on a voltage generated across the diode.

* * * * *